(12) United States Patent
Vivet et al.

(10) Patent No.: US 6,903,303 B2
(45) Date of Patent: Jun. 7, 2005

(54) METHOD AND EQUIPMENT FOR WELDING CONDUCTORS TO SUBSTRATES

(75) Inventors: Laurent Vivet, Bois d' Arcy (FR); Murielle Gombeau, Olivet (FR)

(73) Assignee: Valeo Electronique et Systemes de Liaison, Montigny le Bretonneux (FR)

( * ) Notice: Subject to any disclaimer, the term of this patent is extended or adjusted under 35 U.S.C. 154(b) by 0 days.

(21) Appl. No.: 10/354,016

(22) Filed: Jan. 30, 2003

(65) Prior Publication Data

US 2003/0183605 A1 Oct. 2, 2003

(30) Foreign Application Priority Data

Jan. 31, 2002 (FR) .............................................. 02 01128

(51) Int. Cl.⁷ .......................... B23K 26/22; B23K 26/32
(52) U.S. Cl. ................................................. 219/121.64
(58) Field of Search ....................... 219/121.63, 121.69, 219/121.83; 228/178, 179.1, 185, 208

(56) References Cited

U.S. PATENT DOCUMENTS

| | | | |
|---|---|---|---|
| 4,538,860 A | * 9/1985 | Edwards et al. | ............ 305/137 |
| 4,697,061 A | 9/1987 | Spater et al. | |
| 4,799,435 A | * 1/1989 | Boutroy | ........................ 109/25 |
| 4,814,922 A | * 3/1989 | Osanai | ..................... 360/130.3 |
| 4,893,901 A | * 1/1990 | Taumberger | ................ 359/894 |
| 5,175,410 A | 12/1992 | Freedman et al. | |
| 5,194,710 A | 3/1993 | McDaniel et al. | |
| 5,604,831 A | 2/1997 | Dittman et al. | |
| 5,632,630 A | 5/1997 | Card et al. | |
| 5,742,025 A | 4/1998 | Dittman et al. | |
| 5,763,854 A | 6/1998 | Dittman et al. | |
| 5,809,793 A | * 9/1998 | Shutt et al. | .................... 62/158 |
| 5,852,257 A | 12/1998 | Dittman et al. | |
| 6,138,898 A | * 10/2000 | Will et al. | .................. 228/157 |
| 6,547,895 B2 | * 4/2003 | Bradley et al. | ............. 148/535 |
| 6,704,163 B1 | * 3/2004 | Detjens et al. | ........... 360/244.5 |

FOREIGN PATENT DOCUMENTS

EP      1118412      7/2001
JP      407272981 A   * 10/1995

* cited by examiner

Primary Examiner—Samuel M. Heinrich
(74) Attorney, Agent, or Firm—Greenblum & Bernstein, P.L.C.

(57) ABSTRACT

A method of welding conductors to substrates with a stud attached to the substrate consists in welding to the substrate a stud which has the same composition by volume as the conductor and fastening the conductor to the stud by laser spot welding.

12 Claims, 2 Drawing Sheets

METHOD AND EQUIPMENT FOR WELDING CONDUCTORS TO SUBSTRATES

CROSS-REFERENCE TO RELATED APPLICATIONS

This application is based on French Patent Application No. 02 01128 filed Jan. 31, 2002, the disclosure of which is hereby incorporated by reference thereto in its entirety, and the priority of which is hereby claimed under 35 U.S.C. §119.

BACKGROUND OF THE INVENTION

1. Field of the Invention

The present invention is aimed at welding electrical conductors such as flexible or rigid metal bands to substrates such as direct bonding copper (DBC) insulated metal substrates.

Because the conductors carry high currents, their composition is generally based on copper.

2. Description of the Prior Art

A number of techniques have been used for welding conductors to substrates. Electric welding has been tried but proves to be very difficult because the heating is insufficient because of the very high electrical conductivity of copper. To remedy this drawback, consideration has been given to using tungsten electrodes, which generate a strong heating effect when current flows; heat from the electrodes propagates quickly into the copper parts to be welded, which increases the electrical resistance of the copper.

Electron column welding has also been used, but can only be carried out in a vacuum and continuously. Also, this method demagnetizes adjacent parts.

The present invention is aimed at a method and at equipment which remedy these drawbacks.

SUMMARY OF THE INVENTION

The method according to the invention attaches a terminal to the substrate and a stud having the same composition by volume as the conductor is attached to the stud by laser spot welding.

This avoids heating of the stud, which is harmful to the substrate, and the surface of the conductor is heated by the radiation absorbed by the material. Because the laser radiation is focused onto small areas, it generates very high power densities and the metal is vaporized. Expansion of the vapor causes a backward pressure which, acting on the underlying liquid bath, displaces the liquefied material from the center of the laser spot toward the edges. A hot gas capillary forms and penetrates in depth for as long as the pressure at the bottom of the capillary is sufficiently high. The vaporized metal ionizes to form a plasma, which is heated.

To facilitate welding in the middle portions of said conductor, a stud is preferably used whose dimensions are slightly greater than those of one end of the conductor intended to be welded to the stud.

According to another feature of the method according to the invention the conductor is coated, for example nickel-plated, prior to spot welding.

The spot welds are preferably disposed in an X. They can equally well be disposed in a W.

The invention is also aimed at equipment for implementing the above method, of the type including a base with means for guiding and positioning the substrate, means for guiding one end of a conductor, means for pressing said one end against the stud, and a frame rigidly supporting a laser welding head which is connected to appropriate power supply and control means, which equipment is characterized in that one end of an arm is fixed to the frame and its other end supports deflectors which are extended by guides that constitute the means for guiding the end of the conductor, the frame being mobile along a column upstanding from the base, which has grooves for guiding the substrate and a retractable abutment for positioning it.

According to another feature, the guide means and the means for pressing the end of the conductor against the stud include a low thermal conductivity refractory material sole.

The low thermal conductivity refractory material sole is preferably made of tungsten.

The invention also provides for a method of attaching a conductor to a stud of a substrate, wherein the method comprises spot welding the conductor to the stud, and wherein the conductor and the stud have the same composition by volume.

The stud may comprise a width that is greater than a width of a portion of the conductor. The stud may comprise a length that is greater than a length of the portion of the conductor. The stud may comprise a weld contact area that is greater than a weld contact area of the conductor.

The method may further comprise coating the conductor prior to spot welding. The method may further comprise nickel plating the conductor prior to spot welding.

The spot welding may comprise forming a X-shaped weld pattern. The spot welding may comprise forming a W-shaped weld pattern.

The invention also provides for a device for attaching a conductor to a stud of a substrate according to the method described above, wherein the device comprises a frame member and a laser welding head supported by the frame member. The laser head is connected to a power supply and a control system. A base is adapted to guide the substrate when the substrate is positioned thereon. The base comprises grooves for guiding the substrate and a retractable abutment. A guiding mechanism is used for positioning one end of the conductor relative to the stud. The guiding mechanism comprises guides and deflectors connected to the guides. The frame member is movably mounted to a column that extends from the base.

The guides may comprise surfaces that press the conductor against the stud. The surfaces may comprise a low thermal conductivity refractory material. The low thermal conductivity refractory material may comprise tungsten. The guides may be connected to the frame member via an arm.

The invention also provides for a method of attaching a conductor having a planar portion to a stud of a substrate using a welding device that includes a base, a movable guiding mechanism and welding head, wherein the method comprises arranging the substrate on the base, positioning the planar portion of the conductor against a planar portion of the stud, moving the guiding mechanism into contact with the planar portion of the conductor until the conductor is pressed against the stud, and spot welding the planar portion of the conductor to the planar portion stud, wherein a material composition of the conductor and a material composition of the stud are the same.

The invention also provides for a device for attaching a conductor to a stud of a substrate, wherein the device comprises a base that removably retains the substrate when the substrate is positioned thereon. The base comprises a column. A frame member is movably mounted to the column. A guiding mechanism comprises guides and deflectors connected to the guides. The guide mechanism is connected to the frame member via an arm. A laser welding head is mounted to the frame member. The guides comprise surfaces that press a portion of the conductor against the stud when the frame member is moved towards the base.

The invention is described in more detail next with reference to one particular embodiment cited by way of example only and shown in the accompanying drawings.

DETAILED DESCRIPTION OF THE PREFERRED EMBODIMENT

Figure 1:
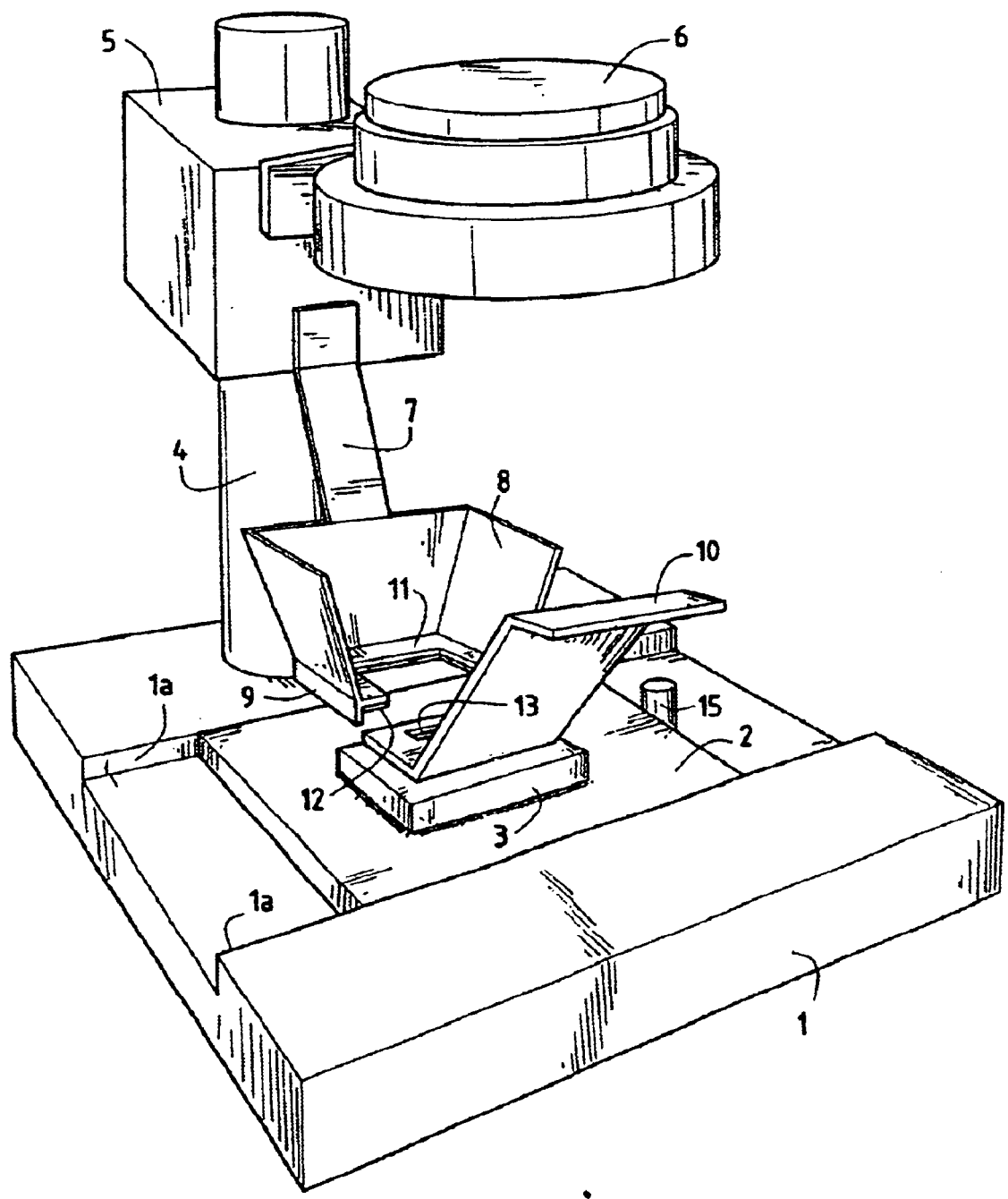
FIG. 1 is a perspective view of equipment according to the invention.
Figure 2:
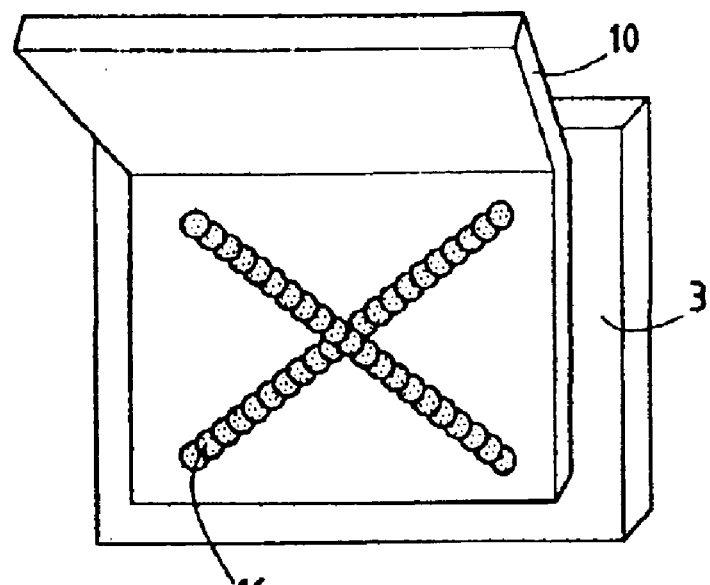
FIG. 2 is a perspective view showing the spot welds.

The equipment shown in the figures includes a base 1 with grooves 1a for guiding a substrate 2 and a retractable abutment 15 for immobilizing the substrate in the welding position. The substrate includes an aluminum base, a polymer layer and a thin layer of copper onto which is brazed beforehand a stud 3 which is made of copper or an alloy based on copper and which has a nickel underlayer.

A column 4 is mounted on the base 1 and a frame 5 can move along the column.

The frame 5 rigidly supports a laser welding head 6 in which the laser column is moved by galvanometer mirrors.

To the frame 5 is fixed one end of an arm 7 whose other end supports deflectors 8 extended by guides 9 for centering and guiding a conductor 10. The deflectors 8 have an internal rim 11 underneath which is a tungsten sole 12.

The conductor 10 is less than 1 mm thick; if its inherent thickness is greater than 1 mm, it can be punched in the area to be welded to produce a thinned portion 13.

The conductor 10 is preferably nickel-plated to facilitate initial absorption of the laser radiation by its upper face, nickel producing an unlimited solid solution with copper.

The stud 3 has dimensions slightly greater than those of the end of the conductor 10 to facilitate welding by overlapping.

The composition by volume of the stud 3 is identical to that of the conductor 10 to reduce the risk of alloys forming that have a low solidification temperature, encouraging hot cracking.

The frame 5 is moved along the column 4 so that the substrate 2 can be inserted between the guide grooves 1a and immobilized by the retractable abutment 15, the corresponding end of the conductor 10 sliding under the tungsten sole 12 and being held by the guides 9; the frame 5 is lowered so that the portion of the conductor to be welded is pressed firmly against the stud 3, which prevents splashing and makes the weld highly reproducible. After welding, the abutment 15 is retracted and the substrate 2 and the conductor 10 are taken off and replaced by two other components to be assembled.

The laser head 6 and the means for holding the conductor against the stud are carried by the frame 5 to ensure that these components are positioned correctly to guarantee good spot welds.

During welding, the deflectors 8 recover any residual splashes.

The spot welds 16 are disposed in an X in order to limit movements of the conductor about a preferred axis if the conductor and the stud are subjected to mechanical stresses or vibrations.

Figure 3:
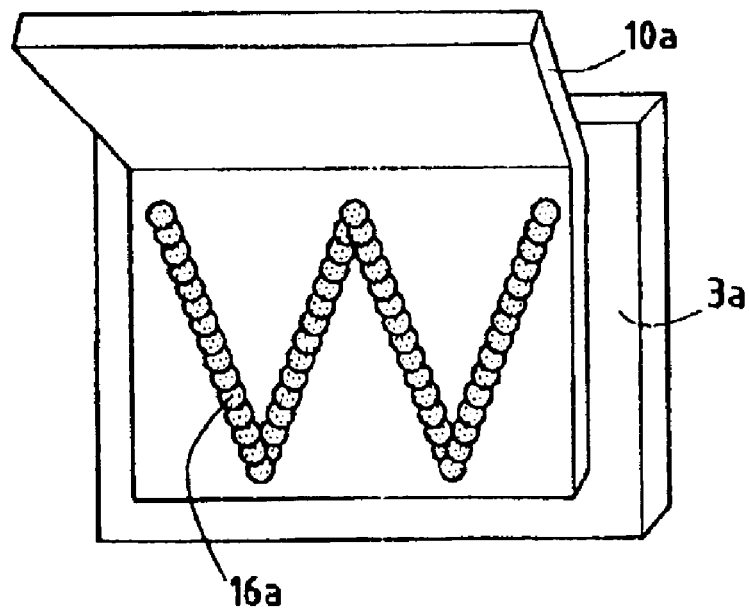
FIG. 3 is another perspective view showing a different disposition of the spot welds.

As shown in FIG. 3, the spot welds 16a can instead form a W.

Of course, the invention is not limited to the embodiment just described and shown. Many modifications of detail can be made thereto without departing from the scope of the invention.

What is claimed is:

1. A method of attaching a conductor to a stud of a substrate using a laser welding device comprising a base, a guiding mechanism, and a welding head, the method comprising:

positioning the substrate on the base;

positioning a planar portion of the conductor onto a planar surface of the stud;

pressing the planar portion of the conductor against the stud with the guiding mechanism; and spot welding, with the laser welding device, the planar portion of the conductor to the planar surface of the stud, wherein the conductor and the stud have the same composition by volume.

2. The method of claim 1, wherein the stud comprises a width that is greater than a width of a portion of the conductor.

3. The method of claim 2, wherein the stud comprises a length that is greater than a length of the portion of the conductor.

4. The method of claim 1, wherein the stud comprises a weld contact area that is greater than a weld contact area of the conductor.

5. The method of claim 1, further comprising coating the conductor prior to spot welding.

6. The method of claim 1, further comprising nickel plating the conductor prior to spot welding.

7. The method of claim 1, wherein the spot welding comprises forming a X-shaped weld pattern.

8. The method of claim 1, wherein the spot welding comprises forming a W-shaped weld pattern.

9. A method of attaching a conductor having a planar portion to a stud of a substrate using a welding device that includes a base, a movable guiding mechanism and welding head, the method comprising:

arranging the substrate on the base;

positioning the planar portion of the conductor against a planar portion of the stud;

moving the guiding mechanism into contact with the planar portion of the conductor until the conductor is pressed against the stud; and spot welding the planar portion of the conductor to the planar portion stud, wherein a material composition of the conductor and a material composition of the stud are the same.

10. The method of claim 9, further comprising nickel plating the conductor prior to spot welding.

11. The method of claim 9, wherein the spot welding comprises forming a X-shaped weld pattern.

12. The method of claim 9, wherein the spot welding comprises forming a W-shaped weld pattern.

* * * * *